United States Patent
Abrokwah et al.

(10) Patent No.: US 9,508,661 B2
(45) Date of Patent: Nov. 29, 2016

(54) MOISTURE BARRIER FOR SEMICONDUCTOR STRUCTURES WITH STRESS RELIEF

(71) Applicant: Avago Technologies General IP (Singapore) Pte. Ltd., Singapore (SG)

(72) Inventors: Jonathan Abrokwah, Fort Collins, CO (US); Forest Dixon, Timnath, CO (US); Thomas Dungan, Fort Collins, CO (US); Greg Halac, Fort Collins, CO (US); Rick Snyder, Windsor, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 3 days.

(21) Appl. No.: 14/334,645

(22) Filed: Jul. 17, 2014

(65) Prior Publication Data

US 2016/0020179 A1 Jan. 21, 2016

(51) Int. Cl.
*H01L 23/06* (2006.01)
*H01L 23/10* (2006.01)
*H01L 23/522* (2006.01)
*H01L 23/00* (2006.01)
*H01L 23/31* (2006.01)

(52) U.S. Cl.
CPC ......... *H01L 23/564* (2013.01); *H01L 23/3192* (2013.01); *H01L 24/05* (2013.01); *H01L 24/13* (2013.01); *H01L 24/18* (2013.01); *H01L 23/562* (2013.01); *H01L 2224/04042* (2013.01); *H01L 2224/0508* (2013.01); *H01L 2224/05144* (2013.01); *H01L 2224/13023* (2013.01); *H01L 2224/13026* (2013.01); *H01L 2224/13147* (2013.01); *H01L 2924/01022* (2013.01); *H01L 2924/0132* (2013.01); *H01L 2924/01074* (2013.01); *H01L 2924/059* (2013.01); *H01L 2924/05042* (2013.01); *H01L 2924/05442* (2013.01)

(58) Field of Classification Search
None
See application file for complete search history.

(56) References Cited

U.S. PATENT DOCUMENTS

| | | | |
|---|---|---|---|
| 8,536,707 B2 | 9/2013 | Wholey et al. | |
| 2008/0042226 A1* | 2/2008 | Nagai | G06K 9/00053 257/417 |
| 2010/0059853 A1 | 3/2010 | Lin et al. | |
| 2012/0025269 A1 | 2/2012 | Parkhurst et al. | |
| 2012/0025370 A1 | 2/2012 | Wholey et al. | |
| 2013/0134560 A1 | 5/2013 | Wholey et al. | |
| 2013/0285119 A1 | 10/2013 | Perkins et al. | |
| 2014/0120667 A1 | 5/2014 | Gates et al. | |
| 2014/0138746 A1 | 5/2014 | Abrokwah et al. | |

OTHER PUBLICATIONS

Murugesan, et al. "High-step-coverage Cu-lateral interconnections over 100 μm thick chips on a polymer substrate—an alternative method to wire bonding", Journal of Micromechanics and Microengineering vol. 22, 2012.
Zorman, et al., "Design and Fabrication", The MEMS Handbook.

* cited by examiner

*Primary Examiner* — Pamela E Perkins

(57) ABSTRACT

A semiconductor structure is disclosed. The semiconductor structure includes an electrically conductive layer disposed over a substrate. A moisture barrier layer is disposed over the substrate and between the substrate and the electrically conductive layer. A dielectric layer is disposed over the moisture barrier layer. The dielectric layer has an elastic modulus that is lower than an elastic modulus of the moisture barrier layer.

45 Claims, 8 Drawing Sheets

MOISTURE BARRIER FOR SEMICONDUCTOR STRUCTURES WITH STRESS RELIEF

BACKGROUND

Packaged semiconductor structures can be negatively impacted by exposure to environment, particularly moisture. The semiconductor structures typically include dielectric materials on various surfaces, which may be permeable or otherwise may crack or become defective, enabling moisture to penetrate the electrical circuits. The moisture may cause short circuits, as well as disintegrate the components within the packaged semiconductor structure.

In order for moisture barrier layers to effectively seal the circuit against moisture, the layers should remain intact throughout the fabrication, assembly, and life of the product. Unfortunately, in many known packaged semiconductor structures, ambient temperature and humidity result in expansion of various layers beneath the moisture barrier layer creates stress on the moisture barrier layer, which can lead to cracking of the moisture barrier layer. Cracking of the moisture barrier layer can compromise its effectiveness and lead to the deleterious results noted above.

What is needed, therefore, is a semiconductor structure that overcomes the shortcomings of known structures, such as those described above.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

Figure 1:
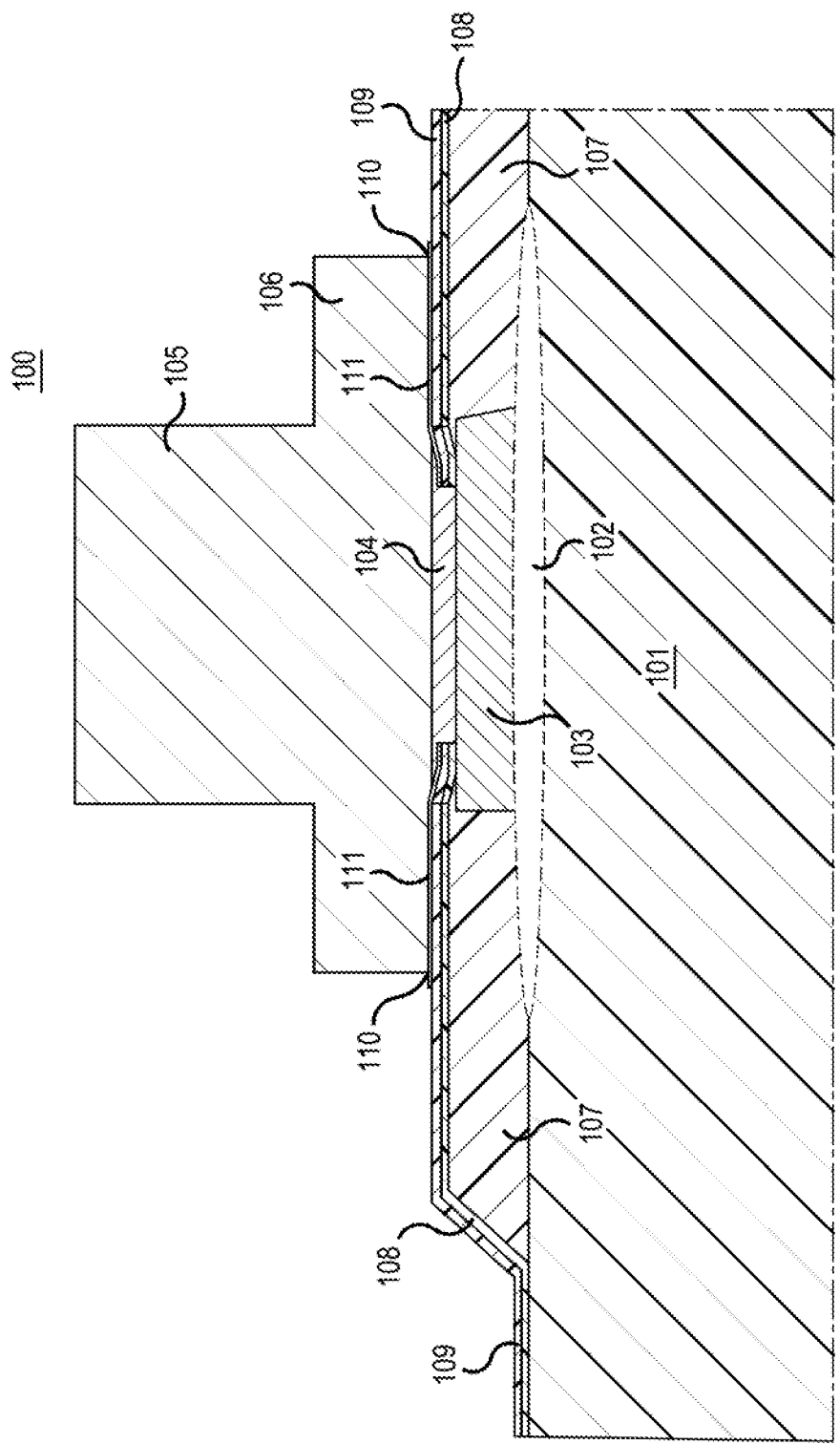
FIG. 1 shows a cross-sectional view semiconductor structure in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, representative embodiments disclosing specific details are set forth in order to provide a thorough understanding of the present teachings. Descriptions of known systems, devices, materials, methods of operation and methods of manufacture may be omitted so as to avoid obscuring the description of the example embodiments. Nonetheless, systems, devices, materials and methods that are within the purview of one of ordinary skill in the art may be used in accordance with the representative embodiments.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other.

Certain representative embodiments are directed to semiconductor structure. The semiconductor structure comprises: a substrate comprising a semiconductor device, or a passive electrical element, or both, disposed therein, or thereover, or both; an electrically conductive layer disposed over the substrate, and configured to make electrical contact with the semiconductor device, or the passive electrical element, or both, the electrically conductive layer having an edge forming a perimeter of the electrically conductive layer; a moisture barrier layer disposed over the substrate and between the substrate and the electrically conductive layer; and a dielectric layer disposed over the moisture barrier layer, the dielectric layer comprising an elastic modulus that is lower than an elastic modulus of the moisture barrier layer.

Certain representative embodiments are directed to semiconductor structure. The semiconductor structure comprises: a substrate comprising a semiconductor device, or a passive electrical element, or both, disposed therein, or thereover, or both; an electrically conductive layer disposed over the substrate, and configured to make electrical contact with the semiconductor device, or the passive electrical element, or both, the electrically conductive layer having an edge forming a perimeter of the electrically conductive layer; an adhesion layer disposed beneath the electrically conductive layer and extending past the edges; and a moisture barrier layer disposed beneath the adhesion layer.

FIG. 1 shows a cross-sectional view of semiconductor structure 100 in accordance with a representative embodiment. The semiconductor structure 100 comprises a substrate 101. A region 102 identifies a general location where semiconductor devices and/or electrical components are disposed. Notably, the semiconductor devices and electrical components may be formed in the substrate 101 partially or completely, or may be formed over the substrate 101, or both. The semiconductor structure 100 further comprises an interconnect 103, which usefully effects connections between the semiconductor devices and/or electrical components disposed in region 102 to circuitry outside the semiconductor structure 100. The interconnect 103 is electrically in contact with an electrically conductive pillar (hereinafter "pillar") 105 via a portion 104 of the pillar 105. The pillar 105 includes an edge 106 that forms a perimeter of the pillar 105. The semiconductor structure 100 further comprises a layer 107 disposed over the substrate 101 and between region 102 and a moisture barrier layer 108, which is disposed over the layer 107 and the substrate 101, and beneath the edge 106 of the pillar 105. A dielectric layer 109 is disposed over the moisture barrier layer 108, and thus extends beneath the edge 106 as well. As described more fully below, in certain embodiments, the adhesion layer 111 is useful in reducing stress at the moisture barrier layer 108.

Generally, the substrate 101 illustratively comprises a III-V semiconductor material that serves as a device substrate from which semiconductor devices can be formed. The region 102 comprises such III-V semiconductor devices, which includes devices comprising layers (e.g., epitaxial layers) of two or more Group III-V materials. So, for example, the semiconductor materials may include binary alloys (e.g., gallium(III) arsenide (GaAs)), ternary alloys (e.g. indium gallium arsenide (InGaAs)) and quaternary alloys (four elements, e.g. aluminum gallium indium phosphide (AlInGaP)) alloys. As noted above, the various components of the semiconductor devices may be formed in the substrate 101 partially or completely, or may be formed over the substrate 101, or both. For purposes of illustration, the semiconductor devices contemplated for use in the semiconductor structure 100 include, but are not limited to, devices useful in power amplifiers commonly used in communications (e.g., wireless communication) applications. In a representative embodiment, the region 102 may comprise a microwave integrated circuit (MIC), or a millimeter wave integrated circuit (MMIC), or a microwave and millimeter wave integrated circuit (MIMIC), or the semiconductor structure 100 may comprise a MIC, or an MMIC, or an MIMIC. As such, the region 102 may comprise one or more heterojunction bipolar transistors (HBTs), or one or more pseudomorphic high electron mobility transistors (pHEMTs), or one or more enhanced pHEMTs (E-pHEMTs), or combinations thereof. The pHEMTs and the E-pHEMT contemplated for use in the semiconductor structure 100 may be as described in commonly owned U.S. Patent Application Publication 20130285119 to Perkins, et al. and U.S. Patent Application Publication 20140138746 to Abrokwah, et al. The disclosures of these patent application publications are specifically incorporated herein by reference. Finally, as noted above, region 102 may comprise electrical components formed in or disposed over the substrate 101. These electrical components are within the purview of one of ordinary skill in the art and are needed in circuit applications for the semiconductor structure 100. Illustratively, these electrical components include, but are certainly not limited to filters, capacitors, inductors, resistors and circuit traces useful in devices such as power amplifiers. As will be appreciated by one of ordinary skill in the art, the electrical components are those within the purview of large-scale integration and very large-scale integration circuit technology.

The interconnect 103 is provided over the substrate 101 and usefully provides connections to circuitry outside the semiconductor structure 100. The interconnect 103 is normally gold or similar electrically conductive material, or a suitable alloy.

The pillar 105 is formed over the interconnect 103, with portion 104 making immediate electrical contact with the interconnect 103. The pillar 105 is illustratively a copper pillar, and may be a pillar as described in commonly owned U.S. Patent Application Publications 20130134560 and 20120025370 to Wholey, et al. and U.S. Patent Application Publication 20120025269 to Parkhurst, et al. The disclosures of these patent application publications are specifically incorporated herein by reference.

Generally, the method of fabricating the pillar 105 and the materials useful in the fabrication of the pillar 105 are known. As such, only a brief description is presented. The adhesion layer 111 is sputtered over the wafer and pad opening created in the dielectric layer 109, moisture barrier layer 108, and layer 107 to interconnect 103. The adhesion layer 111 functions as adhesion layer for the pillar 105. Notably, the adhesion layer 111 enables a comparatively thin layer (not shown) of conducting material (e.g., Cu) to be formed over the dielectric layer 109, or the moisture barrier layer 108 (depending on the embodiment), and the interconnect 103. This comparatively thin layer of conducting material formed over the adhesion layer 111 functions as a seed layer for plating the pillar 105.

Figure 2:
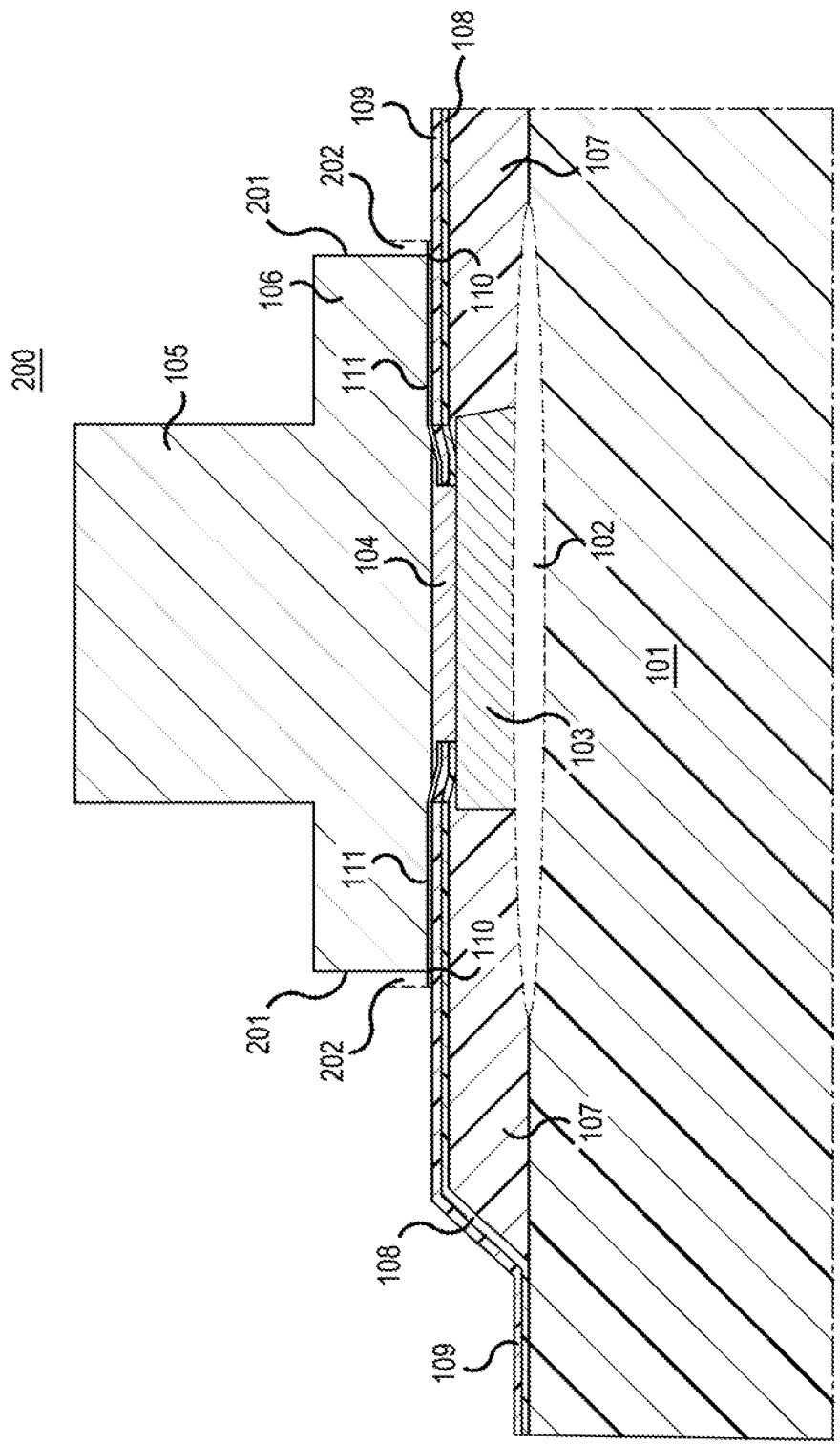
FIG. 2 shows a cross-sectional view semiconductor structure in accordance with a representative embodiment.

A photoresist is applied and patterned. Next, the pillar 105 is formed over the interconnect 103, and over a portion of the dielectric layer 109 by electroplating. As described more fully below, the adhesion layer 111 may be provided beneath the edge 106 and terminate thereunder, or, as shown in FIGS. 1 and 2, may extend beyond the termination of the edge 106 and continue over a portion of the dielectric layer 109. Notably, the adhesion layer 111 comprises titanium (Ti), tungsten (W) or an alloy thereof (TiW). Finally, while the adhesion layer 111 is provided in many representative embodiments, other representative embodiments are contemplated where the adhesion layer 111 is not provided. Illustratively, the adhesion layer 111 may be foregone in semiconductor structure 100, and, as such, there is no other layer disposed between the dielectric layer 109 and the pillar 105. In such an embodiment, the dielectric layer 109 cushioning of the moisture barrier layer 108 is provided solely by the dielectric layer 109.

After the plating sequence is complete, the photoresist is stripped away, and a deplating or etching sequence is carried out to remove the primary metal from field regions of the semiconductor structure 100 to form the resultant pillar 105 with edge 106.

Finally, and as will become clearer as the description continues, the material for the adhesion layer 111 is etched using a known wet or dry etch sequence to provide the adhesion layer 111 as desired in the semiconductor structure 100 of various representative embodiments. In certain embodiments, when the adhesion layer 111 is etched, it is masked by the pillar 105 with a wet etch, the over-etch of the adhesion layer 111 typically recesses under the edge 106 of the pillar 105 and produces a gap (not shown in FIG. 1). As described more fully below, strain induced by expansion of the underlying layer 107 on the moisture barrier layer 108 at certain locations is mitigated by the dielectric layer 109. In yet other embodiments the adhesion layer 111 is formed to extend past the edge 106, and alone, or together with the dielectric layer 109, mitigates the stress induced on the moisture barrier layer 108.

The layer 107 is disposed over the interconnect metallization (not shown) disposed over the substrate 101 as well as and other components of region 102. The layer 107 is sometimes referred to as a planarization layer. Generally, layer 107 comprises a dielectric material that has a comparatively low relative permittivity ($\in_r$) or dielectric constant. Such materials are sometime referred to as low-k materials and are particularly attractive for planarization layers (e.g., layer 107) in devices configured to operate at comparatively high frequencies, such as microwave or millimeter wave frequencies. Often, materials useful for layer 107 are comparatively low dielectric constant organic materials, such as benzocyclobutene (BCB), polybenzoxazole (PBO), or polyimide materials. As described more fully below, these organic low-k materials have a higher thermal expansion coefficient than higher-k inorganic dielectrics such as SiN. Higher temperatures and increased humidity cause these low-k dielectric materials to expand to a greater extent than most high-k dielectric materials, and this expansion causes comparatively high mechanical stresses in layers disposed over the low-k dielectric layer. As noted above, these high stresses can cause cracks in moisture barrier layers thereby degrading moisture reliability. The present teachings relate to structures that significantly reduce the mechanical stress on the moisture barrier layer 108 as described below.

The moisture barrier layer 108 is formed over the layer 107 and extends beneath the edge 106 and the pillar 105, terminating at the terminus of the layer 107 at the interconnect 103 as shown. The moisture barrier layer 108 comprises a dielectric material that is substantially impervious to moisture. As such, moisture from the ambient is substantially prevented from permeating to the circuits, devices and components beneath the moisture barrier layer 108, including but not limited to the interconnects disposed over the substrate 101, and the semiconductor devices and electrical components in region 102. For example, in a known environmental testing sequence, the temperature of a packaged MMIC comprising semiconductor structure 100 is increased from room temperature to 125° C. and temperature held for 24 hours. The packaged MMIC is then held in a 60° C./60% relative humidity environment for 24 hours. Finally the packaged MMIC is heated from room temperature to 260° C. under an infra-red source. This last step is repeated on the order of 3 cycles to 10 cycles, during which the moisture barrier layer 108 must substantially prevent moisture from permeating to components thereunder.

The moisture barrier layer 108 has an elastic modulus (modulus of elasticity) that is greater than the elastic modulus of the dielectric layer 109 disposed thereover. For example, the elastic modulus of the moisture barrier layer 108 is between approximately 310 GPa and approximately 400 GPa. In accordance with a representative embodiment, the moisture barrier layer 108 comprises silicon nitride (SiN) with chemical formulation $Si_3N_4$ and has a thickness in the range of approximately 4000 Å to approximately $1.6 \times 10^4$ Å (1600 nm). The moisture barrier layer 108 is deposited using known deposition techniques, such as plasma enhanced chemical vapor deposition (PECVD), which are within the purview of one of ordinary skill in the art.

Dielectric layer 109 is formed over the moisture barrier layer 108, extends beneath the edge 106 and the pillar 105, terminating at the terminus of the of the moisture barrier layer 108 at the interconnect 103 as shown. As noted above, when the ambient temperature, or moisture level, or both, increase, the layer 107 tends to expand essentially in all directions. The pillar 105 is made of a material that is rigid compared to many other materials of the semiconductor structure 100, and therefore, comparatively non-compliant when the layer 107 expands. At points 110 (sometime referred to as "anchor points"), near the terminus of the edge 106, a fulcrum is created by the pillar 105 by the expansion of the layer 107. Without the benefits of the various features of the representative embodiments, the stress induced at the points 110 and the regions beneath the edge 106 near the points 110 routinely exceed the maximum stress the moisture barrier layer 108 can endure without cracking or otherwise unacceptably deforming. By contrast, in the presently described representative embodiments, and the representative embodiments described below, the dielectric layer 109 acts as a "cushioning" layer, so the stress induced on the moisture barrier layer 108 at the points 110 is below the minimum stress that will induce cracks in the moisture barrier layer 108.

Beneficially, the dielectric layer 109 is selected to have a modulus of elasticity that is comparatively low in order to absorb stress on the moisture barrier layer 108. As such, the dielectric layer 109 has a lower elastic modulus than the elastic modulus of elastic modulus of the moisture barrier layer 108. For example, the elastic modulus of the dielectric layer 109 is between approximately 50 GPa and approximately 250 GPa.

In addition to its comparatively low elastic modulus, the dielectric layer 109 beneficially has a yield strength that is selected to substantially prevent the stress induced in the moisture barrier layer 108 from exceeding the level at which cracking and other deformation that can compromise its ability to substantially prevent moisture from permeating to the features of the semiconductor structure 100 beneath the layer 107 (e.g., the interconnects disposed over the substrate 101, and the semiconductor devices and electrical components in region 102). As noted above, dielectric layer 109 has an elastic modulus that is comparatively less than the elastic modulus of the moisture barrier layer 108. Illustratively, the dielectric layer 109 has an elastic modulus in the range of approximately 50 GPa to approximately 250 GPa. In accordance with a representative embodiment, dielectric layer 109 comprises one or more layers of SiON, or a mixture of $SiO_2$ and SiN, also known as silicon oxynitride. As noted above, dielectric layer 109 has an elastic modulus that is comparatively less than the elastic modulus of the moisture barrier layer 108. Illustratively, the dielectric layer 109 has an elastic modulus in the range of approximately 50 GPa to approximately 250 GPa and has a thickness in the range of approximately 4000 Å (400 nm) to 8000 Å (800 nm)

Illustratively, the material used for the dielectric layer 109 and the thickness of the dielectric layer 109 are selected to have a yield strength that is at least 650 MPa, and even greater than 1 GPa.

In the presently described representative embodiment, the maximum stress induced in the moisture barrier layer 108 is less than approximately 650 MPa. Illustratively, the maximum stress induced in the moisture barrier layer 108 through the inclusion of dielectric layer 109 ($SiO_2$ having a thickness of 8000 Å) of the representative embodiment of FIG. 1 is typically in the range of approximately 238 MPa to approximately 479 MPa. This variation in the range generally depends on the structures near the boundaries of the edge 106 and thus near points 110.

Finally, it is noted that while the stress induced on the dielectric layer 109 can exceed level at which cracking and other deformation can occur in the dielectric layer 109, the cushioning effect of the dielectric layer 109 substantially prevents the stress induced on the moisture barrier layer 108 from reaching a magnitude at which the moisture barrier layer 109 can crack or otherwise deform and compromise its ability to substantially prevent moisture from permeating to the features of the semiconductor structure beneath the layer 107 (e.g., the interconnects disposed over the substrate 101, and the semiconductor devices and electrical components in region 102).

FIG. 2 shows a cross-sectional view of semiconductor structure 200 in accordance with a representative embodiment. Many aspects and features of the semiconductor structure 200 are substantively the same as the semiconductor structure 100 described above in connection with representative embodiments above. As such, details of these common aspects and features may not be repeated to avoid obscuring the description of the presently described representative embodiments.

The semiconductor structure 200 comprises substrate 101, with region 102 identifying the general location where semiconductor devices and/or electrical components noted above are disposed, and may be formed in the substrate 101 partially or completely, or may be formed over the substrate 101, or both. The semiconductor structure 100 further comprises the interconnect 103, which is electrically in contact with the pillar 105 via a portion 104 of the pillar 105. The pillar 105 includes an edge 106 that forms a perimeter of the pillar 105. The semiconductor structure 200 further comprises layer 107 disposed over the substrate 101 and between substrate 101 and a moisture barrier layer 108, which is disposed over the layer 107 and the substrate 101, and beneath the edge 106 of the pillar 105. Dielectric layer 109 is disposed over the moisture barrier layer 108, and thus extends beneath the edge 106 as well.

The semiconductor structure 200 also comprises an adhesion layer 111 that is disposed over the dielectric layer 109 as depicted. In the presently described representative embodiment, the adhesion layer 111 extends over the dielectric layer 109 to one terminus over the interconnect 103 on one side, and, significantly, extends past a side 203 of the edge 106 by a distance 204 on another side. As such, the adhesion layer 111 of the representative embodiment, is provided beneath the points 110, and extends past the points 110 (and the side 203 of the edge 106) by a distance 204.

As noted above, the adhesion layer 111 is provided to foster the formation of the pillar 105. The pillar 105 is plated through a photoresist pattern formed on the adhesion layer 111. After its formation, and the photoresist removed, the adhesion layer 111 is etched to remove it from certain areas (e.g., field regions) where it is not desired. The adhesion layer 111 is often masked by the material used to form the pillar 105 and etched using a known wet-etch sequence. Normally, and in a representative embodiment described below, the adhesion layer 111 is over-etched forming a recess that recesses it under the edge 106 (producing a "gap" described below). However, in the presently described embodiment, the edge 106 is further etched using a known copper wet etchant to reveal the adhesion layer 111 that extends the distance 204 past the side 202 of the edge 106.

While the initial use of the adhesion layer 111 is to foster formation of the pillar 105, the extension of the adhesion layer 111 past the edge 106. The adhesion layer 111 is selected from a material that has an elastic modulus that is less than the elastic modulus of the moisture barrier layer 108, and thus, at points 110 provides cushioning in addition to that provided by dielectric layer 109. Illustratively, the adhesion layer 111 has an elastic modulus in the range of approximately 105 GPa to approximately 120 GPa. Typically, the adhesion layer 111 comprises a metal, and illustratively one or more layers of comprises titanium (Ti) and tungsten (W), or a TiW alloy, and has a thickness in the range of approximately 500 Å to approximately 1000 Å. In illustrative embodiments the distance 204 is approximately 0.25 µm to approximately 3.0 µm.

In the presently described representative embodiment, the maximum stress induced in the moisture barrier layer 108 is less than approximately 650 MPa. Illustratively, the maximum stress induced in the moisture barrier layer 108 through the inclusion of dielectric layer 109 ($SiO_2$ having a thickness of 8000 Å) and adhesion layer 111 (Ti having a thickness of 1000 Å) of the representative embodiment of FIG. 2 is typically in the range of approximately 212 MPa to approximately 420 MPa. This variation in the range generally depends on the structures near the boundaries of the edge 106 and thus near points 110.

Beneficially, the combined cushioning provided by the dielectric layer 109 and the adhesion layer 111 at the points 110 prevent the stress induced in the moisture barrier layer 108 from exceeding the level at which cracking and other deformation that can compromise its ability to substantially prevent moisture from permeating to the features of the semiconductor structure 200 beneath the layer 107 (e.g., the interconnects disposed over the substrate 101, and the semiconductor devices and electrical components in region 102).

Finally, it is noted that while the stress induced on the dielectric layer 109 can exceed level at which cracking and other deformation can occur in the dielectric layer 109, the cushioning effect of the dielectric layer 109 substantially prevents the stress induced on the moisture barrier layer 108 from reaching a magnitude at which the moisture barrier layer 108 can crack or otherwise deform and compromise its ability to substantially prevent moisture from permeating to the features of the semiconductor structure 200 beneath the layer 107 (e.g., the interconnects disposed over the substrate 101, and the semiconductor devices and electrical components in region 102).

Figure 3:
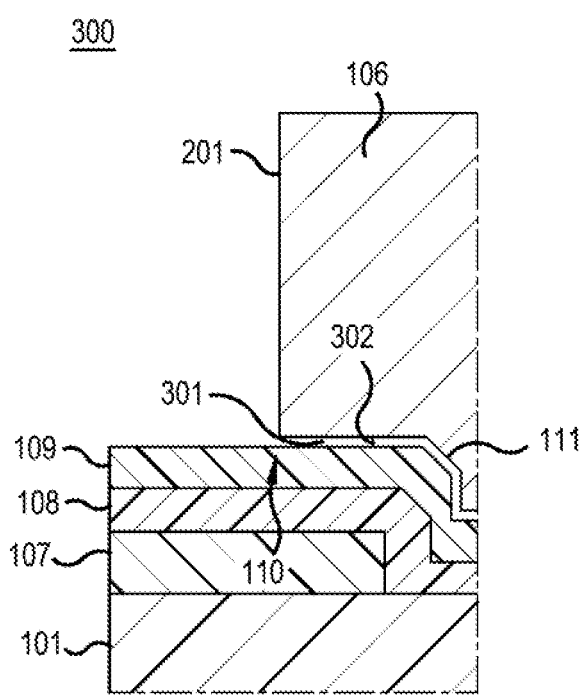
FIG. 3 shows a cross-sectional view of a portion of a semiconductor structure in accordance with a representative embodiment.

FIG. 3 shows a cross-sectional view of a portion of a semiconductor structure 300 in accordance with a representative embodiment. Many aspects and features of the semiconductor structure 300 are substantively the same as the semiconductor structure 100 and the semiconductor structure 200 described above in connection with representative embodiments above. As such, details of these common aspects and features may not be repeated to avoid obscuring the description of the presently described representative embodiments.

The semiconductor structure 300 comprises substrate 101, with region 102 identifying the general location where semiconductor devices and/or electrical components noted above are disposed, and may be formed in the substrate 101 partially or completely, or may be formed over the substrate 101, or both. The semiconductor structure 100 further comprises the interconnect 103, which is electrically in contact with the pillar 105 via a portion 104 of the pillar 105. The pillar 105 includes an edge 106 that forms a perimeter of the pillar 105. The semiconductor structure further comprises layer 107 disposed over the substrate 101 and between substrate 101 and a moisture barrier layer 108, which is disposed over the layer 107 and the substrate 101, and beneath the edge 106 of the pillar 105. Dielectric layer 109 is disposed over the moisture barrier layer 108, and thus extends beneath the edge 106 as well.

The semiconductor structure 300 also comprises adhesion layer 111 that is disposed over the dielectric layer 109 as depicted. However, and as noted above, unlike the semiconductor structure 200 where the adhesion layer 111 extend past the edge 106, the adhesion layer 111 in the presently described representative embodiment is "over-etched" revealing a gap 301 extending from the side 203 to the edge 302 of the adhesion layer 111. In representative embodiments, the length of the gap 301 (i.e., the distance 202 between side 203 and edge 302) is in the range of approximately 0.25 µm to approximately 2.5 µm.

Like the semiconductor structures 100, 200, semiconductor structure 300 comprises points 110 (with a similar point on the opposing side of pillar 105, not shown in FIG. 3) near the terminus of the edge 106, where a fulcrum is created by the pillar 105 by the expansion of the layer 107. Again, the dielectric layer 109 cushions the moisture barrier layer 108, and absorbs a significant portion of the stress induced on the moisture barrier layer 108 at points 110. Beneficially, the magnitude of the stress induced on the moisture barrier layer 108 at points 110 is below the minimum stress that will induce cracks in the moisture barrier layer 108. As such, the cushioning effect of the dielectric layer 109 substantially prevents the stress induced in the moisture barrier layer 108 from exceeding the level at which cracking and other deformation that can compromise its ability to substantially prevent moisture from permeating to the features of the semiconductor structure 300 beneath the layer 107 (e.g., the interconnects disposed over the substrate 101), and the semiconductor devices and electrical components in region 102 (not shown in FIG. 3).

In the presently described representative embodiment, the maximum stress induced in the moisture barrier layer 108 is less than approximately 650 MPa. Illustratively, with the length of the gap 301 being 0.25 µm and the thickness of the adhesion layer 111 being 1000 Å, the maximum stress induced in the moisture barrier layer 108 through the inclusion of dielectric layer 109 (SiO$_2$ having a thickness of 8000 Å) of the representative embodiment of FIG. 3 is typically in the range of approximately 238 MPa to approximately 365 MPa. This variation in the range generally depends on the structures near the boundaries of the edge 106 and thus near points 110.

Finally, it is again noted that while the stress induced on the dielectric layer 109 can exceed levels at which cracking and other deformation can occur in the dielectric layer 109, the cushioning effect of the dielectric layer 109 substantially prevents the stress induced on the moisture barrier layer 108 from reaching a magnitude at which the moisture barrier layer 108 can crack or otherwise deform and compromise its ability to substantially prevent moisture from permeating to the features of the semiconductor structure 300 beneath the layer 107.

Figure 4:
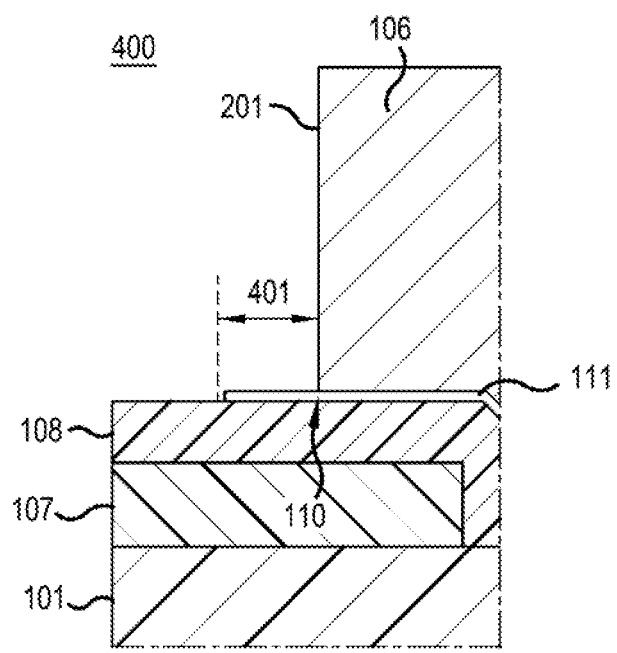
FIG. 4 shows a cross-sectional view of a portion in accordance with a representative embodiment.

FIG. 4 shows a cross-sectional view of a portion of a semiconductor structure 400 in accordance with a representative embodiment. Many aspects and features of the semiconductor structure 400 are substantively the same as the semiconductor structures 100~300 described above in connection with representative embodiments above. As such, details of these common aspects and features may not be repeated to avoid obscuring the description of the presently described representative embodiments.

The semiconductor structure 400 comprises substrate 101, with region 102 (not shown) identifying the general location where semiconductor devices and/or electrical components noted above are disposed, and may be formed in the substrate 101 partially or completely, or may be formed over the substrate 101, or both. The semiconductor structure 400 further comprises the interconnect 103 (not shown), which is electrically in contact with the pillar 105 via a portion 104 of the pillar 105. The pillar 105 includes an edge 106 that forms a perimeter of the pillar 105. The semiconductor structure further comprises layer 107 disposed over the substrate 101 and between substrate 101 and a moisture barrier layer 108, which is disposed over the layer 107 and the substrate 101, and beneath the edge 106 of the pillar 105. Notably, however, dielectric layer 109 in semiconductor structure 400 is not provided over the moisture barrier layer 108, but rather adhesion layer 111 extends over moisture barrier layer 208 past edge 203 by a distance 401.

Like the semiconductor structures 100~300, semiconductor structure 400 comprises point 110 (with a similar point 110 on the opposing side of pillar 105, not shown in FIG. 4) near the terminus of the edge 106, where a fulcrum is created by the pillar 105 by the expansion of the layer 107. However, adhesion layer 111 alone suitably cushions the moisture barrier layer 108 by flexing, and absorbs a significant portion of the stress induced on the moisture barrier layer 108 at points 110. Beneficially, the magnitude of the stress induced on the moisture barrier layer at point 110 is below the minimum stress that will induce cracks in the moisture barrier layer 108. As such, the cushioning effect of flexing by the adhesion layer extension substantially prevents the stress induced in the moisture barrier layer 108 from exceeding the level at which cracking and other deformation that can compromise its ability to substantially prevent moisture from permeating to the features of the semiconductor structure beneath the layer 107 (e.g., the interconnects disposed over the substrate 101, and the semiconductor devices and electrical components in region 102 (not shown in FIG. 4).

In illustrative embodiments the distance 204 is approximately 0.25 µm to approximately 3 µm. In the presently described representative embodiment, the maximum stress induced in the moisture barrier layer 108 is less than approximately 650 MPa. Illustratively, with the length of the gap 301 being between approximately 0.25 µm and approximately 3.0 µm, and the thickness of the adhesion layer 111 being 1000 Å, the maximum stress induced in the moisture barrier layer 108 through the inclusion of adhesion layer 111 of the representative embodiment of FIG. 4 is typically in the range of approximately 406 MPa to approximately 607 MPa. This variation in the range generally depends on the structures near the boundaries of the edge 106 and thus near points 110.

Figure 5:
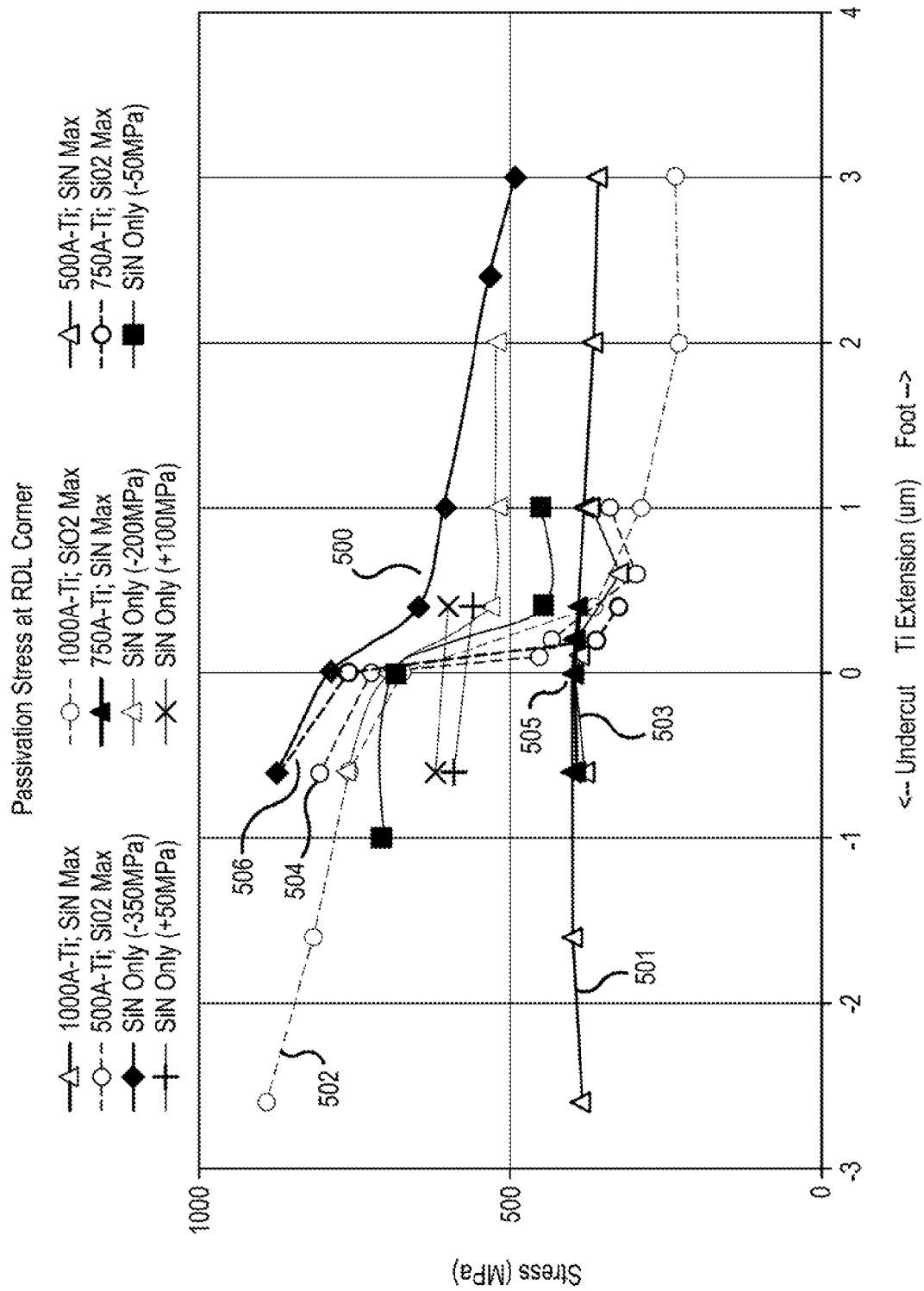
FIG. 5 is a graph showing stress versus length of adhesion layer extension/undercut in accordance with a representative embodiment.

FIG. 5 is a graph showing stress versus length of adhesion layer extension/undercut in accordance with a representative embodiment. As will become clearer as the present description continues, FIG. 5 provides comparisons of stress induced on the moisture barrier layer 108, and on the dielectric layer 109, in some examples, at points 110. The description of FIG. 5 often refers back to the semiconductor structures 100~400 described above in connection with representative embodiments above.

Curve 500 depicts the maximum stress induced at points 110 in moisture barrier layer that does not comprise a dielectric layer 109. The moisture barrier layer 108 has an initial deposited compressive stress level in the film of −350 MPa. As can be appreciated, the stress induced at an anchor point is unacceptably high when the adhesion layer extension is an "undercut" (negative values in FIG. 5). However, when the adhesion layer extends by distance 401 by at least approximately 1.0 µm the maximum stress induced in moisture barrier layer 108 well below the maximum acceptable level. Thereby, cracking is substantially avoided in the moisture barrier layer 108. This is in keeping with the present teachings: without the inclusion of dielectric layer 109, the adhesion layer 111, when extended by a sufficient distance 401 provides suitable cushioning and protects the moisture barrier layer 108 from stress induced at points 110.

In the case of the stack that comprises the moisture barrier layer 108 and the dielectric layer 109, curve 501 depicts the maximum stress induced at points 110 in moisture barrier layer 108 (in this case illustratively SiN) over an "extension" of the adhesion layer (in this case illustrative titanium having a thickness of approximately 1000 Å) from approximately –2.5 µm (i.e., an "undercut" or gap 301) to approximately 3.0 µm (i.e., an extension of the adhesion layer 11l by distance 204). As can be appreciated, the maximum stress induced in moisture barrier layer 108 over the ranges of lengths of the "extension" is well below the maximum acceptable level. Thereby, cracking is substantially avoided in the moisture barrier layer 108. Notably, and as can be seen in curve 502, the stress induced at points 110 in dielectric layer 109 (in this case illustratively SiO$_2$) is comparatively high over the ranges of an undercut and even for with a comparatively short extension. As can be appreciated, therefore, the dielectric layer 109 absorbs a significant portion of the stress induced at points 110, and thus cushions the moisture barrier layer 108.

Curve 503 depicts the maximum stress induced at points 110 in moisture barrier layer 108 (in this case illustratively SiN) over an "extension" of the adhesion layer (in this case illustrative titanium having a thickness of approximately 500 Å) from approximately –0.75 µm (i.e., an "undercut" or gap 301) to approximately 1.0 µm (i.e., an extension of the adhesion layer 111 by distance 204). As can be appreciated, the maximum stress induced in moisture barrier layer 108 over the ranges of lengths of the "extension" is well below the maximum acceptable level. Thereby, cracking is substantially avoided in the moisture barrier layer 108. Notably, and as can be seen in curve 504, the stress induced at points 110 in dielectric layer 109 (in this case illustratively SiO$_2$) is comparatively high over the ranges of an undercut and even for with a comparatively short extension. As can be appreciated, therefore, the dielectric layer 109 absorbs a significant portion of the stress induced at points 110, and thus cushions the moisture barrier layer 108.

Curve 505 depicts the maximum stress induced at point 110 in moisture barrier layer 108 (in this case illustratively SiN) over an "extension" of the adhesion layer 111 (in this case illustratively titanium having a thickness of approximately 750 Å) from approximately –0.75 µm (i.e., an "undercut" or gap 301) to approximately 1.0 µm (i.e., an extension of the adhesion layer 111 by distance 204). As can be appreciated, the maximum stress induced in moisture barrier layer 108 over the ranges of lengths of the "extension" is well below the maximum acceptable level. Thereby, cracking is substantially avoided in the moisture barrier layer 108. Notably, and as can be seen in curve 506, the stress induced at points 110 in dielectric layer 109 (in this case illustratively SiO$_2$) is comparatively high over the ranges of an undercut and even for with a comparatively short extension. As can be appreciated, therefore, the dielectric layer 109 absorbs a significant portion of the stress induced at point 110, and thus cushions the moisture barrier layer 108.

Curves 507~510 depict the stress levels at initial deposition in the moisture barrier layer 108. Notably, the initial stress level in the moisture barrier layer 108 in curve 507 is approximately –200 MPa, in curve 508 is approximately –50 MPa, in curve 509 is approximately 100 MPa and in curve 510 is approximately 50 MPa. As can be appreciated, the beneficial affect of the extension by distance 202 of the adhesion layer 111 of at least 0.25 µm results in reduced stress in the moisture barrier layer 108 near points 110.

Figure 6:
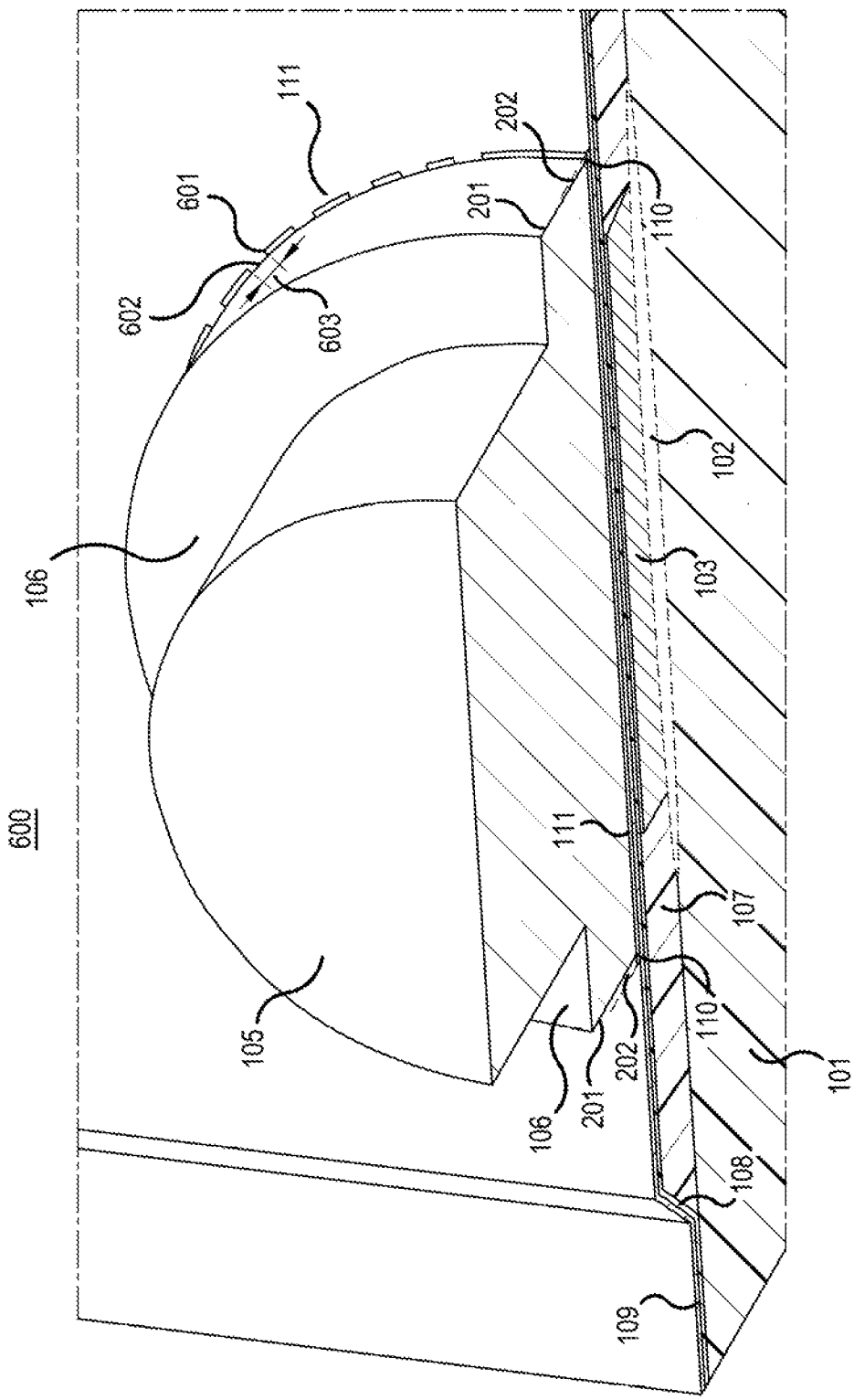
FIG. 6 shows a cross-sectional view semiconductor structure in accordance with a representative embodiment.

FIG. 6 shows a cross-sectional view of semiconductor structure 600 in accordance with a representative embodiment. Many aspects and features of the semiconductor structure 600 are substantively the same as the semiconductor structures 100~400 described above in connection with representative embodiments above. As such, details of these common aspects and features may not be repeated to avoid obscuring the description of the presently described representative embodiments.

The semiconductor structure 600 comprises substrate 101, with region 102 identifying the general location where semiconductor devices and/or electrical components noted above are disposed, and may be formed in the substrate 101 partially or completely, or may be formed over the substrate 101, or both. The semiconductor structure 100 further comprises the interconnect 103, which is electrically in contact with the pillar 105 via a portion 104 of the pillar 105. The pillar 105 includes an edge 106 that forms a perimeter of the pillar 105. The semiconductor structure 600 further comprises layer 107 disposed over the substrate 101 and between substrate 101 and a moisture barrier layer 108, which is disposed over the layer 107 and the substrate 101, and beneath the edge 106 of the pillar 105. Dielectric layer 109 is disposed over the moisture barrier layer 108, and thus extends beneath the edge 106 as well.

The semiconductor structure 600 also comprises adhesion layer 111 that is disposed over the dielectric layer 109 as depicted. In the representative embodiment, the adhesion layer 111 comprises extensions 601 past the edge 106. In the present embodiment, the extensions 601 are similar to the extension of adhesion layer 111 past the edge 106 by distance 202 as described in connection with representative embodiments of FIG. 2. Alternatively, the dielectric layer 109 could be foregone, and the extensions 601 would be similar to the extension of the adhesion layer 111 past the edge 106 by a distance 401 described in connection with representative embodiments of FIG. 4. The adhesion layer 111 also comprises recesses 602 that extend under the pillar 105 (e.g., like the recesses that form the gap 301 described in connection with representative embodiments of FIG. 3). The recesses 602 have a width 603, and the extensions 601 have a pitch (center-to-center spacing of the extensions 601).

As can be appreciated, the "serrated" structure of the adhesion layer 111 formed by the extensions 601 and recesses 602 can occur during the formation process of the extension of the adhesion layer 111 as depicted in FIG. 2. However, the serrated structure of the adhesion layer 111 formed by the extensions 601 and recesses 602 substantially prevents the stress induced in the moisture barrier layer 108 from exceeding the level at which cracking and other deformation that can compromise its ability to substantially prevent moisture from permeating to the features of the semiconductor structure 200 beneath the layer 107 (e.g., the interconnects disposed over the substrate 101, and the semiconductor devices and electrical components in region 102). In illustrative embodiments the length of the extensions 601 of the adhesion layer 111l past the edge 106 is approximately 0.5 µm to approximately 3.0 µm, and the length of the recess under the edge 106 (e.g., the length of gap 301 described in connection with representative embodiment of FIG. 3) is in the range of approximately 0.5 µm to approximately 1.0 µm.

Finally, it is again noted that while the stress induced on the dielectric layer 109 can exceed level at which cracking and other deformation can occur in the dielectric layer 109, the cushioning effect of the dielectric layer 109 substantially prevents the stress induced on the moisture barrier layer 108 from reaching a magnitude at which the moisture barrier layer 108 can crack or otherwise deform and compromise its ability to substantially prevent moisture from permeating to the features of the semiconductor structure 600 beneath the layer 107.

Figure 7:
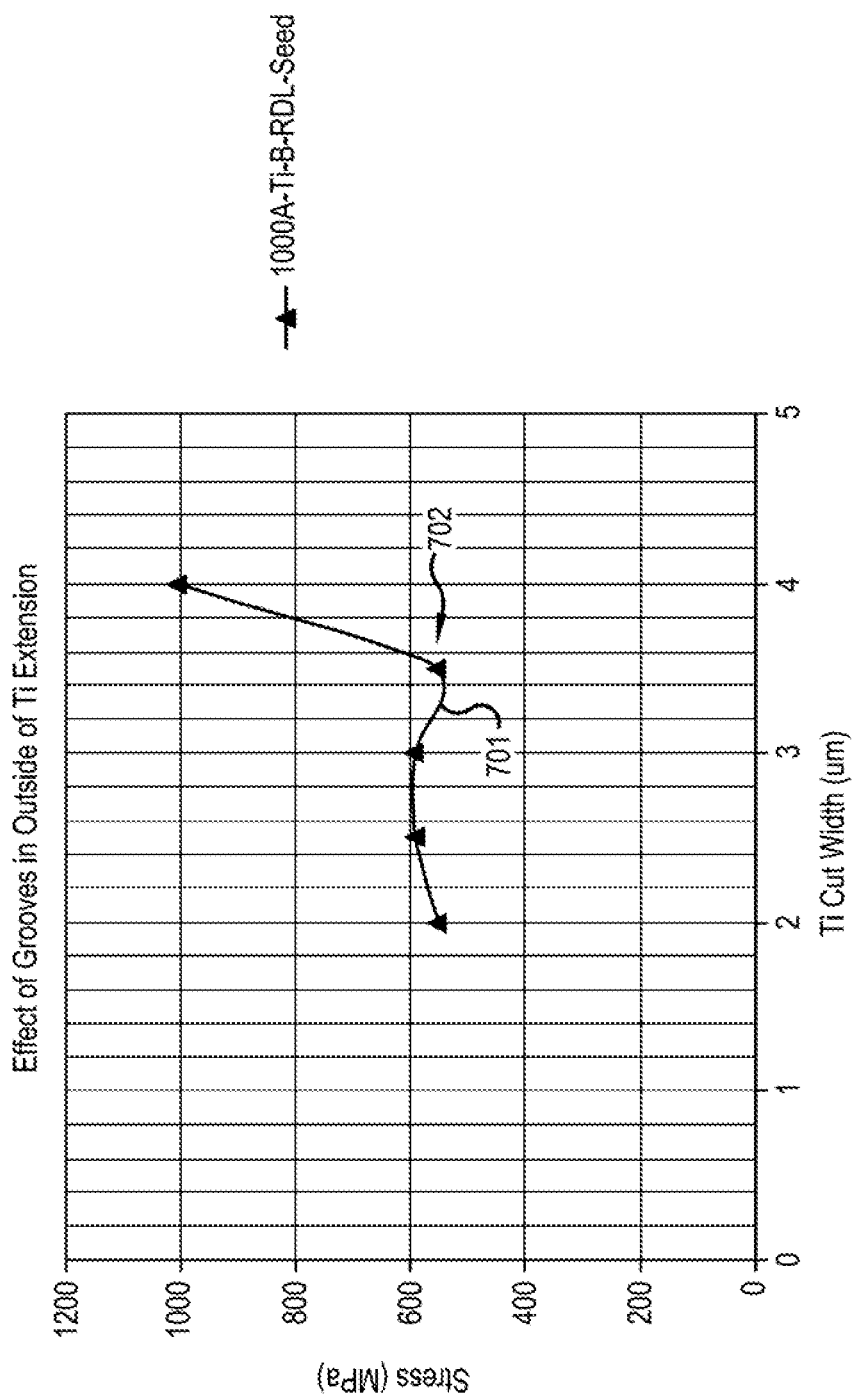
FIG. 7 is a graph showing stress versus length of adhesion layer extension/undercut in accordance with a representative embodiment.

FIG. 7 is a graph showing stress versus cut width of the adhesion layer extension in accordance with a representative embodiment. The curve 701 shows the stress at points 110 over a range of widths 603 (sometimes referred to as "cut widths"). The pitch of the extensions 601 are approximately 5 µm or higher in most regions around the pillar 105. The depth of the recesses 602 under the pillar 105 is approximately 0.5 µm. As can be seen at point 702, when the width 603 exceeds approximately 3.5 µm length of the extensions 601 past the edge 106 decrease significantly, stress at points 110 increases and this type of serrated extension may fail to prevent cracks in the moisture barrier layer 108.

Figure 8:
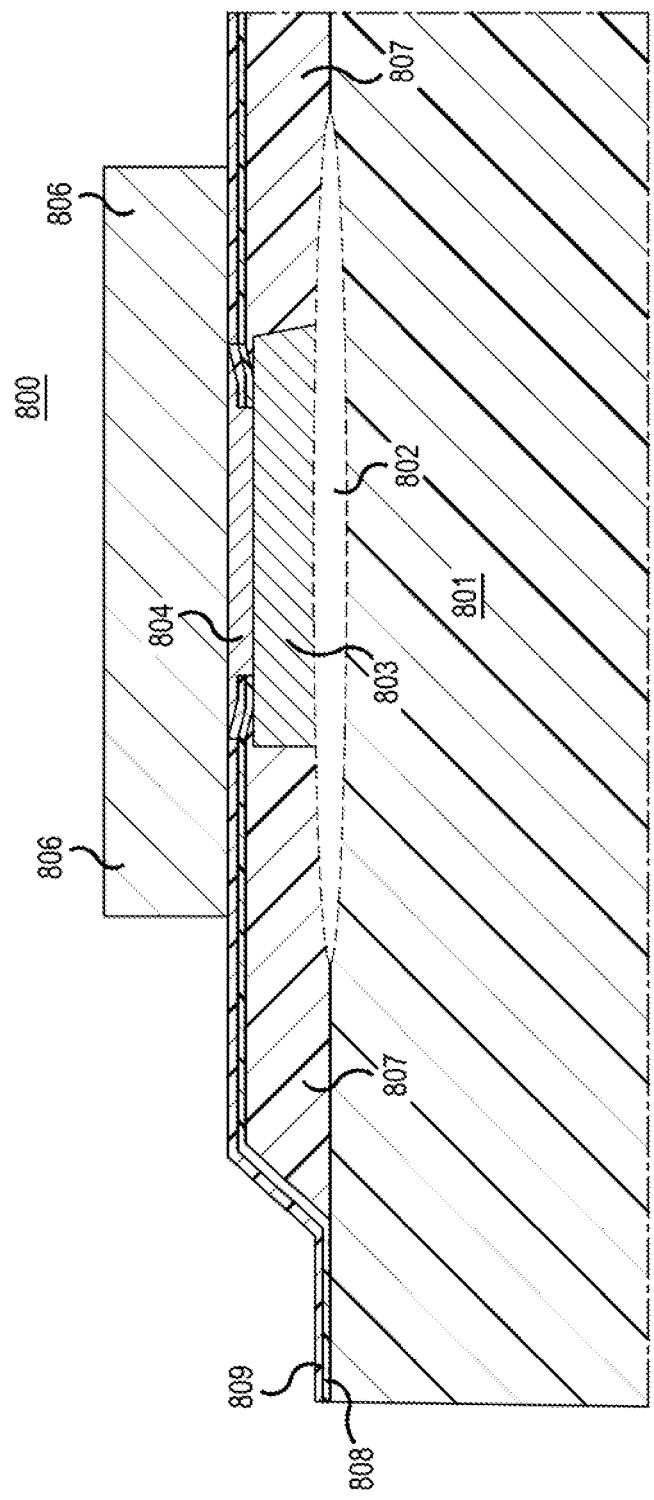
FIG. 8 shows a cross-sectional view semiconductor structure in accordance with a representative embodiment.

FIG. 8 shows a cross-sectional view of semiconductor structure 800 in accordance with a representative embodiment. The semiconductor structure 800 is configured to facilitate electrical connection to a wire bond (not shown). The semiconductor structure 800 comprises a substrate 801. A region 802 identifies a general location where semiconductor devices and/or electrical components are disposed. Notably, the semiconductor devices and electrical components may be formed in the substrate 801 partially or completely, or may be formed over the substrate 801, or both. The semiconductor structure 800 further comprises an interconnect 803, which usefully effects connections between the semiconductor devices and/or electrical components disposed in region 802 to circuitry outside the semiconductor structure 800. The interconnect 803 is electrically in contact with an electrically conductive bond pad 805 via a portion 804 of the bond pad 805. The bond pad 805 is configured to have the wire bond electrically connected thereto using a known technique. The bond pad 805 includes an edge 806 that forms a perimeter of the bond pad 805. The semiconductor structure 800 further comprises a layer 807 disposed over the substrate 801 and between region 802 and a moisture barrier layer 808, which is disposed over the layer 807 and the substrate 801, and beneath the edge 806 of the bond pad 805. A dielectric layer 809 is disposed over the moisture barrier layer 808, and thus extends beneath the edge 806 as well. Finally, and although not shown in FIG. 8, adhesion layer 111 is often provided to foster the plating sequence to form the bond pad 805.

The various layers and components of the semiconductor structure 800 are substantively the same as those of semiconductor structures 100~400 and 600, and are not described in detail. Notably, the various configurations of components of the semiconductor structures 100~400 and 600 are readily adapted for use in the semiconductor structure 800 and are contemplated for use therein. Moreover, the same beneficial cushioning described in connection with semiconductor structures 100~400 and 600 is realized in the semiconductor structure 800. Beneficially, this cushioning substantially prevents the stress induced on the moisture barrier layer 808 from reaching a magnitude at which the moisture barrier layer 808 can crack or otherwise deform and compromise its ability to substantially prevent moisture from permeating to the features of the semiconductor structure 800 beneath the layer 807 (e.g., the interconnects disposed over the substrate 801, and the semiconductor devices and electrical components in region 802).

In view of this disclosure it is noted that the methods and devices can be implemented in keeping with the present teachings. Further, the various components, materials, structures and parameters are included by way of illustration and example only and not in any limiting sense. In view of this disclosure, the present teachings can be implemented in other applications and components, materials, structures and equipment needed to implement these applications can be determined, while remaining within the scope of the appended claims.

The invention claimed is:

1. A semiconductor structure, comprising:
   a substrate comprising a semiconductor device, or a passive electrical element, or both, disposed therein, or thereover, or both;
   an electrically conductive layer disposed over the substrate, and configured to make electrical contact with the semiconductor device, or the passive electrical element, or both, the electrically conductive layer having an edge forming a perimeter of the electrically conductive layer;
   a moisture barrier layer disposed over the substrate and between the substrate and the electrically conductive layer; and
   a dielectric layer disposed over the moisture barrier layer, and between the moisture barrier layer and the electrically conductive layer, the dielectric layer having an elastic modulus that is lower than an elastic modulus of the moisture barrier layer; and
   an adhesion layer disposed beneath the electrically conductive layer.

2. A semiconductor structure as claimed in claim 1, wherein the elastic modulus of the dielectric layer is between approximately 50 GPa and approximately 250 GPa.

3. A semiconductor structure as claimed in claim 1, wherein the elastic modulus of the moisture barrier layer is between approximately 310 GPa and approximately 400 GPa.

4. A semiconductor structure as claimed in claim 1, wherein the maximum induced stress of the moisture barrier layer near edges of the adhesion layer is less than approximately 650 MPa.

5. A semiconductor structure as claimed in claim 1, further comprising a planarization layer disposed between the substrate and the moisture barrier layer.

6. A semiconductor structure as claimed in claim 1, wherein the dielectric layer comprises $SiO_2$.

7. A semiconductor structure as claimed in claim 1, wherein the dielectric layer comprises SiON.

8. A semiconductor structure as claimed in claim 1, wherein the moisture barrier layer comprises $Si_3N_4$.

9. A semiconductor structure as claimed in claim 1, wherein the adhesion layer comprise titanium (Ti), tungsten (W) or TiW.

10. A semiconductor structure as claimed in claim 1, further comprising a pillar comprising an electrically conductive material disposed over the electrically conductive layer.

11. A semiconductor structure as claimed in claim 1, further comprising a stack of electrically conductive layers disposed over the electrically conductive layer, wherein an upper most layer of the stack comprises a material adapted for connecting to a wirebond.

12. A semiconductor structure as claimed in claim 1, wherein the moisture barrier layer comprises $Si_3N_4$.

13. A semiconductor device as claimed in claim 1, wherein a gap exists between the edge and the moisture barrier layer.

14. A semiconductor structure as claimed in claim 13, wherein the gap terminates at the adhesion layer.

15. A semiconductor structure, comprising:
   a substrate comprising a semiconductor device, or a passive electrical element, or both, disposed therein, or thereover, or both;
   an electrically conductive layer disposed over the substrate, and configured to make electrical contact with the semiconductor device, or the passive electrical element, or both, the electrically conductive layer having an edge forming a perimeter of the electrically conductive layer;
   a moisture barrier layer disposed over the substrate and between the substrate and the electrically conductive layer;
   a dielectric layer disposed over the moisture barrier layer, the dielectric layer having an elastic modulus that is lower than an elastic modulus of the moisture barrier layer; and
   an adhesion layer disposed beneath the electrically conductive layer, wherein a gap exists between the edge and the moisture barrier layer.

16. A semiconductor structure as claimed in claim 15, wherein the gap terminates at the adhesion layer.

17. A semiconductor structure as claimed in claim 15, wherein the elastic modulus of the dielectric layer is between approximately 50 GPa and approximately 250 GPa.

18. A semiconductor structure as claimed in claim 15, wherein the elastic modulus of the moisture barrier layer is between approximately 310 GPa and approximately 400 GPa.

19. A semiconductor structure as claimed in claim 15, wherein the maximum induced stress of the moisture barrier layer near edges of the adhesion layer is less than approximately 650 MPa.

20. A semiconductor structure as claimed in claim 15, wherein the dielectric layer comprises $SiO_2$.

21. A semiconductor structure as claimed in claim 15, wherein the dielectric layer comprises SiON.

22. A semiconductor structure as claimed in claim 15, wherein the adhesion layer comprise titanium (Ti), tungsten (W) or TiW.

23. A semiconductor structure as claimed in claim 15, further comprising a pillar comprising an electrically conductive material disposed over the electrically conductive layer.

24. A semiconductor structure, comprising:
   a substrate comprising a semiconductor device, or a passive electrical element, or both, disposed therein, or thereover, or both;
   an electrically conductive layer disposed over the substrate, and configured to make electrical contact with the semiconductor device, or the passive electrical element, or both, the electrically conductive layer having an edge forming a perimeter of the electrically conductive layer;
   a moisture barrier layer disposed over the substrate and between the substrate and the electrically conductive layer;
   a dielectric layer disposed over the moisture barrier layer, the dielectric layer having an elastic modulus that is lower than an elastic modulus of the moisture barrier layer; and
   a stack of electrically conductive layers disposed over the electrically conductive layer, wherein an upper most layer of the stack comprises a material adapted for connecting to a wirebond.

25. A semiconductor structure, comprising:
   a substrate comprising a semiconductor device, or a passive electrical element, or both, disposed therein, or thereover, or both;
   an electrically conductive layer disposed over the substrate, and configured to make electrical contact with the semiconductor device, or the passive electrical element, or both, the electrically conductive layer having an edge forming a perimeter of the electrically conductive layer;
   a moisture barrier layer disposed over the substrate and between the substrate and the electrically conductive layer;
   a dielectric layer disposed over the moisture barrier layer, the dielectric layer having an elastic modulus that is lower than an elastic modulus of the moisture barrier layer;
   a planarization layer disposed between the substrate and the moisture barrier layer; and
   an adhesion layer disposed beneath the electrically conductive layer.

26. A semiconductor structure as claimed in claim 25, wherein a gap exists between the edge and the moisture barrier layer.

27. A semiconductor structure as claimed in claim 26, wherein the gap terminates at the adhesion layer.

28. A semiconductor structure as claimed in claim 25, wherein the elastic modulus of the dielectric layer is between approximately 50 GPa and approximately 250 GPa.

29. A semiconductor structure as claimed in claim 25, wherein the elastic modulus of the moisture barrier layer is between approximately 310 GPa and approximately 400 GPa.

30. A semiconductor structure as claimed in claim 25, wherein the maximum induced stress of the moisture barrier layer near edges of the adhesion layer is less than approximately 650 MPa.

31. A semiconductor structure as claimed in claim 25, wherein the dielectric layer comprises $SiO_2$.

32. A semiconductor structure as claimed in claim 25, wherein the dielectric layer comprises SiON.

33. A semiconductor structure as claimed in claim 32, further comprising a adhesion layer disposed beneath the electrically conductive layer, wherein a gap exists between the edge and the moisture barrier layer.

34. A semiconductor structure as claimed in claim 32, wherein the gap terminates at the adhesion layer.

35. A semiconductor structure as claimed in claim 32, wherein the elastic modulus of the dielectric layer is between approximately 50 GPa and approximately 250 GPa.

36. A semiconductor structure as claimed in claim 32, wherein the elastic modulus of the moisture barrier layer is between approximately 310 GPa and approximately 400 GPa.

37. A semiconductor structure as claimed in claim 32, wherein the maximum induced stress of the moisture barrier layer near edges of the adhesion layer is less than approximately 650 MPa.

38. A semiconductor structure as claimed in claim 32, wherein the dielectric layer comprises $SiO_2$.

39. A semiconductor structure as claimed in claim 32, wherein the dielectric layer comprises SiON.

40. A semiconductor structure as claimed in claim 32, wherein the moisture barrier layer comprises $Si_3N_4$.

41. A semiconductor structure as claimed in claim 32, wherein the adhesion layer comprise titanium (Ti), tungsten (W) or TiW.

42. A semiconductor structure as claimed in claim 32, further comprising a pillar comprising an electrically conductive material disposed over the electrically conductive layer.

43. A semiconductor structure as claimed in claim 25, wherein the moisture barrier layer comprises $Si_3N_4$.

44. A semiconductor structure as claimed in claim 25, wherein the adhesion layer comprise titanium (Ti), tungsten (W) or TiW.

45. A semiconductor structure as claimed in claim 25, further comprising a pillar comprising an electrically conductive material disposed over the electrically conductive layer.

* * * * *